US010215801B2

(12) United States Patent
Nasu

(10) Patent No.: US 10,215,801 B2
(45) Date of Patent: Feb. 26, 2019

(54) CONTACT INSPECTION DEVICE HAVING A PROBE HEAD AND ROTATION RESTRICTING PORTIONS

(71) Applicant: Kabushiki Kaisha Nihon Micronics, Tokyo (JP)

(72) Inventor: Mika Nasu, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 14/934,889

(22) Filed: Nov. 6, 2015

(65) Prior Publication Data
US 2016/0146884 A1    May 26, 2016

(30) Foreign Application Priority Data

Nov. 26, 2014 (JP) ................................. 2014-238713

(51) Int. Cl.
 *G01R 31/28* (2006.01)
 *G01R 1/073* (2006.01)
(52) U.S. Cl.
 CPC ..... *G01R 31/2891* (2013.01); *G01R 1/07307* (2013.01); *G01R 1/07314* (2013.01)
(58) Field of Classification Search
 CPC ............ G01R 31/2891; G01R 1/07307; G01R 1/07314; G01R 3/00; G01R 1/07357;
 (Continued)

(56) References Cited

U.S. PATENT DOCUMENTS 4,843,315 A * 6/1989 Bayer ................ G01R 1/07357
 324/72.5
6,255,832 B1 * 7/2001 Notohardjono .... G01R 1/07357
 324/750.25
(Continued)

FOREIGN PATENT DOCUMENTS

EP         2535726 A    12/2012
JP    2010-281583 A    12/2010
(Continued)

OTHER PUBLICATIONS

Extended European Search Report dated May 9, 2016 for the corresponding European Patent Application No. 15195353.6.
(Continued)

*Primary Examiner* — Lee Rodak
(74) *Attorney, Agent, or Firm* — Leason Ellis LLP

(57) ABSTRACT

A contact inspection device includes: plural probes each having a first end to be brought into contact with a test object; a probe substrate including contact portions in contact with respective second ends of the probes; a probe head through which the probes extend and which is detachably attached to the probe substrate; and plural positioning members which are provided on a surface of the probe head facing the probe substrate and through which the probes extend. Each probe has a rotation restricted portion provided on the side of the second end. Each positioning member has rotation restricting portions adapted to engage the rotation restricted portions. When the positioning members are moved relative to each other, the rotation restricting portions align the probes and switch the probes from a rotation unrestricted state to a rotation restricted state.

23 Claims, 13 Drawing Sheets

(58) Field of Classification Search
CPC ............ G01R 1/06733; G01R 1/06716; G01R 1/06738; G01R 1/06722; G01R 1/073; G01R 1/07342; G01R 1/07371; G01R 1/06711; G01R 1/06761
See application file for complete search history.

(56) References Cited

U.S. PATENT DOCUMENTS

| | | | | |
|---|---|---|---|---|
| 6,278,284 | B1* | 8/2001 | Mori | G01R 1/0483 |
| | | | | 324/756.02 |
| 6,334,783 | B1* | 1/2002 | Hu | H01R 13/4368 |
| | | | | 439/84 |
| 8,723,546 | B2* | 5/2014 | Kister | G01R 1/07314 |
| | | | | 324/754.03 |
| 2001/0028255 | A1* | 10/2001 | Endo | G01R 1/07357 |
| | | | | 324/750.19 |
| 2002/0155735 | A1* | 10/2002 | Zhou | G01R 1/06711 |
| | | | | 439/66 |
| 2005/0124144 | A1* | 6/2005 | Sato | G01R 1/07357 |
| | | | | 438/482 |
| 2005/0258844 | A1* | 11/2005 | Kister | G01R 1/07357 |
| | | | | 324/750.25 |
| 2012/0042509 | A1 | 2/2012 | Takeya | |
| 2013/0057309 | A1* | 3/2013 | Kojima | C25D 1/02 |
| | | | | 324/755.05 |

FOREIGN PATENT DOCUMENTS

| | | |
|---|---|---|
| JP | 2012-42330 A | 3/2012 |
| JP | 2014-1997 A | 1/2014 |
| WO | WO-2004/010152 A | 1/2004 |
| WO | WO-2011/115082 A | 9/2011 |

OTHER PUBLICATIONS

Office Action dated Mar. 2, 2017 for the corresponding Korean Patent Application No. 10-2015-0166665.

* cited by examiner

CONTACT INSPECTION DEVICE HAVING A PROBE HEAD AND ROTATION RESTRICTING PORTIONS This application claims the benefit of Japanese Patent Application No. 2014-238713 filed on Nov. 26, 2014, the entire content of which is hereby incorporated by reference.

FIELD OF THE INVENTION

The present invention relates to a contact inspection device for use in an energization test of semiconductor integrated circuits, and so on.

BACKGROUND OF THE INVENTION

An energization test is conventionally performed on test objects, such as semiconductor integrated circuits, to determine whether the test objects are produced in accordance with exact specifications. Such an energization test is performed using a contact inspection device, such as a probe card, probe unit, and probe block, having plural contacts which are individually pressed against a part to be inspected of a test object. A contact inspection device of this type is used to electrically connect the parts to be inspected of a test object with a tester in order to perform inspection.

As a contact inspection device of this type, JP 2014-1997 A discloses a contact inspection device including a probe substrate having a lower side on which plural probes, each having a first end to be brought into contact with an electrode of a test object, are disposed, a rigid wiring board to be electrically connected to a tester, a reinforcing plate for supporting the rigid wiring board, and a probe support, connected to the probe substrate, for retaining the plural probes in contact with the probe substrate at predetermined positions.

JP 2012-42330 A discloses a contact inspection device produced by temporarily connecting first ends of probes to a probe substrate by softening a conductive joining material attached to the first ends of the probes by heating, inserting second ends of the probes, which will serve as needle tips when brought into contact with a test object, through plural positioning members, positioning the second ends of the probes by moving the positioning members relative to one another, and heating and cooling the joining material again so that the probes can be positioned with respect to the probe substrate and joined thereto.

Problem to be Solved by the Invention

In the contact inspection device disclosed in JP 2014-1997 A, the probe support includes first and second plates facing each other in the axial direction of the probes with a gap therebetween. The probes extend through the first and second plates. The probes extending through the probe support correspond one-to-one to electrodes of the probe substrate and to electrodes of the test object, and electrically connect the probe substrate and the test object.

Each probe of the contact inspection device includes a dogleg-shaped coupling portion located between the first and second plates of the probe support. The coupling portion is elastically deformable under a pressure that acts in the axial direction of the probe, and the elastic force that is generated by the elastic deformation of the coupling portion helps to establish electrical connection between the probe and its corresponding electrode.

When a probe having such a coupling portion rotates about its axis, it may contact an adjacent probe and cause a short-circuit. Also, when such a probe rotates about its axis, the electrode of the probe card in contact with the probe may be worn or damaged. Thus, in this contact inspection device, each probe has protrusions extending radially from a portion thereof. The protrusions are received in elongated grooves in a circular hole formed through the second plate, which faces the test object, and function, in conjunction with the elongated grooves, as rotation prevention means that prevents the probe from rotating about its axis.

In this contact inspection device, however, because the coupling portions of the probes must be located between the first and second plates of the probe support, the second ends of the plural probes must be simultaneously inserted through the first plate with the first ends of the plural probes inserted through the second plate. In other words, when any of the probes in this contact inspection device need replacing, the probes cannot be replaced without disassembling the probe support. This results in lower work efficiency. In addition, in assembling the probe support, the second ends of the plural probes must be simultaneously inserted through the first plate with the first ends of the plural probes inserted through the second plate. This is troublesome and results in lower work efficiency.

In the contact inspection device disclosed in JP 2012-42330 A, the probes cannot be replaced without softening the joining material by heating. This also results in lower work efficiency. In addition, the second ends of the probes must be inserted through the plural positioning members after the joining material is softened by heating to temporarily join the plural probes to the probe substrate. This complicates the assembling process and results in a further decrease in work efficiency.

The present invention has been made in view of the above problems, and it is, therefore, an object of the present invention to provide a contact inspection device configured to reduce wear and damage of the contact portions of the probe substrate in contact with the probes and to facilitate the replacement and assembly of the probes.

SUMMARY OF THE INVENTION

Means for Solving the Problem

For the purpose of accomplishing the above object, a contact inspection device according to a first aspect of the present invention is a contact inspection device that performs contact inspection of a test object, including: plural probes each having a first end to be brought into contact with the test object; a probe substrate including contact portions in contact with respective second ends of the probes; a probe head through which the plural probes extend and which are detachably attached to the probe substrate; and plural positioning members which are provided on a surface of the probe head facing the probe substrate and through which the plural probes extends, each of the probes having a rotation restricted portion provided on the side of the second end, each of the plural positioning members having rotation restricting portions adapted to engage the rotation restricted portions, in which, when the plural positioning members are moved relative to each other, the rotation restricting portions align the probes and switch the probes from a rotation unrestricted state to a rotation restricted state.

According to this aspect, when the plural positioning members are moved relative to each other, the rotation restricting portions align the probes and switch the probes from a rotation unrestricted state to a rotation restricted state. Thus, because the probes are prevented from rotating relative to the contact portions of the probe substrate in contact with the probes, wear or damage of the contact portions of the probe substrate can be reduced.

In addition, according to this aspect, because the probes can be aligned by moving the plural positioning members relative to each other, the probes can be easily positioned and the positional accuracy of the probes can be improved. Thus, the contact portions of the probe substrate can be reduced in size, enabling them to cope with further reduction in pitch.

In addition, according to this aspect, the probes can be switched between a rotation restricted state and a rotation unrestricted state by moving the plural positioning members relative to each other with the probe head removed from the probe substrate. This facilitates maintenance and replacement of the probes and assembly of the probe head, which in turn improves work efficiency in maintenance and replacement of the probes and in assembling the probe head.

A contact inspection device according to a second aspect of the present invention is the contact inspection device according to the first aspect, in which the rotation restricted portions have a polygonal shape, and in which the rotation restricting portions engage at least two sides, or one side and one vertex opposite the one side, of each of the rotation restricted portions to restrict rotation thereof.

According to this aspect, the rotation restricting portions engage at least two sides, or one side and one vertex opposite the one side, of each of the rotation restricted portions having a polygonal shape to restrict rotation thereof. Thus, because the probes are prevented from rotating relative to the contact portions of the probe substrate in contact with the probes, wear or damage of the contact portions of the probe substrate can be reduced.

A contact inspection device according to a third aspect of the present invention is the contact inspection device according to the first or second aspect, in which the plural positioning members include a first positioning member and a second positioning member, in which the rotation restricting portions of the first positioning member and the second positioning member have a rectangular shape, in which the rotation restricted portions have a rectangular shape, and in which, when the first positioning member and the second positioning member are moved relative to each other along a diagonal of the rectangular shape, the rotation restricting portions restrict rotation of the rotation restricted portions.

According to this aspect, the plural positioning members include a first positioning member and a second positioning member, and the rotation restricting portions of the first positioning member and the second positioning member and the rotation restricted portions both have a rectangular shape. When the first positioning member and the second positioning member are moved relative to each other along a diagonal of the rectangular shape, the rotation restricting portions restrict rotation of the rotation restricted portions. Thus, when the first positioning member and the second positioning member are moved relative to each other along a diagonal of the rectangular shape, the four sides of each of the rectangular rotation restricted portions of the probes are restrained by the rotation restricting portions of the first positioning member and the second positioning member. As a result, the probes can be maintained in a rotation restricted state more reliably. In addition, because the four sides of each of the rotation restricted portions are restrained, the probes can be positioned with higher accuracy, enabling them to cope with narrower pitches.

A contact inspection device according to a fourth aspect is the contact inspection device according to the first aspect, in which at least either the rotation restricted portions or the rotation restricting portions have a generally ellipsoidal shape.

The term "generally ellipsoidal shape" as used herein refers not only to a curve made up of the set of all points in a plane for which the sum of the distances from two fixed points is constant but also to an ellipse elongated laterally and having lateral ends pointed at an acute angle and a shape formed by joining semi-circles to opposite ends of a rectangle.

According to this aspect, at least either the rotation restricted portions or the rotation restricting portions have a generally ellipsoidal shape. Thus, when the plural positioning members are moved relative to each other, each of the generally ellipsoidal rotation restricting portions contacts a part of the corresponding one of the rotation restricted portions of the probes and the probes can be aligned and switched from a rotation unrestricted state to a rotation restricted state. Thus, because the probes are prevented from rotating relative to the contact portions of the probe substrate in contact with the probes, wear or damage of the contact portions of the probe substrate can be reduced.

A contact inspection device according to a fifth aspect is the contact inspection device according to any one of the first to fourth aspects, in which each of the probes includes a first contact portion forming the first end of the probe, a second contact portion forming the second end of the probe and having the rotation restricted portion, and an elastic portion having opposite ends to which the first contact portion and the second contact portion are connected and capable of freely expanding and contracting in the axial direction of the probe.

According to this aspect, each of the probes includes an elastic portion capable of freely expanding and contracting in the axial direction of the probe, and first and second contact portions connected to opposite ends of the elastic portion. Thus, when a force is applied to the first and the second contact portions, the elastic portion warps in the axial direction of the probe and applies an elastic force generated by the warp to the first and second contact portions. As a result, the elastic portion can apply an elastic force between the first contact portion and the test object and between the second contact portion and its corresponding contact portion of the probe substrate. This makes the contact between the first contact portion and the test object and the contact between the second contact portion and its corresponding contact portion of the probe substrate more stable, and reduces poor connection therebetween.

A contact inspection device according to a sixth aspect is the contact inspection device according to any one of the first to fifth aspects, in which the second ends of the probes make a line or surface-to-surface contact with the corresponding contact portions of the probe substrate.

According to this aspect, the second ends of the probes make a line or surface-to-surface contact with the corresponding contact portions of the probe substrate. This increases the contact area between the second end of each of the probes and its corresponding contact portion of the probe substrate, thereby providing a more stable electrical connection between the second ends of the probes and the probe substrate.

A contact inspection device according to a seventh aspect is the contact inspection device according to any one of the first to sixth aspects, in which the probe head has holes for receiving the probes, and the rotation restricted portions of the probes are larger in size than the holes.

According to this aspect, the probe head has holes for receiving the probes, and the rotation restricted portions of the probes are larger in size than the holes. Thus, when the probes are inserted through the probe head, the rotation restricted portions cannot pass through the holes. In other words, the rotation restricted portions of the probes also function as a stopper to the probe head.

In addition, according to this aspect, because the rotation restricted portions of the probes contact the holes of the probe head at a position close to their second ends, the probes are supported by the probe head at a position close to their second ends. As a result, the second ends of the probes are restricted from displacing in a direction orthogonal to the axial direction of the probes compared to the first ends thereof. This prevents the second ends of the probes from displacing in the orthogonal direction relative to the contact portions of the probe substrate and can therefore reduce wear or damage of the contact portions of the probe substrate.

A contact inspection device according to an eighth aspect is the contact inspection device according to any one of the first to seventh aspects, in which each of the probes has at least one slit extending spirally in the axial direction of the probe between the first end and the second end.

According to this aspect, each of the probes has at least one slit extending spirally in the axial direction of the probe between the first end and the second end. The slit can absorb the torsion applied to the probe or inclination of the probe and can therefore improve the service life of the probe. In addition, because the slit is formed spirally in the axial direction of the probe, it can also absorb some of the pressure applied in the axial direction and can therefore improve the service life of the probe. In addition, the slit can prevent the probe from breakage or the like and can therefore improve the service life of the contact inspection device.

A contact inspection device according to a ninth aspect is the contact inspection device according to any one of the first to eighth aspects, in which the plural positioning members are made of non-conductive material.

According to this aspect, because the plural positioning members are made of non-conductive material, they can provide reliable insulation between the plural probes extending through the plural positioning members.

BRIEF DESCRIPTION OF THE DRAWINGS

These and other features and advantages of the present invention will become more readily appreciated when considered in connection with the following detailed description and appended drawings, wherein like designations denote like elements in the various views, and wherein.

DETAILED DESCRIPTION OF THE INVENTION

Figure 1:
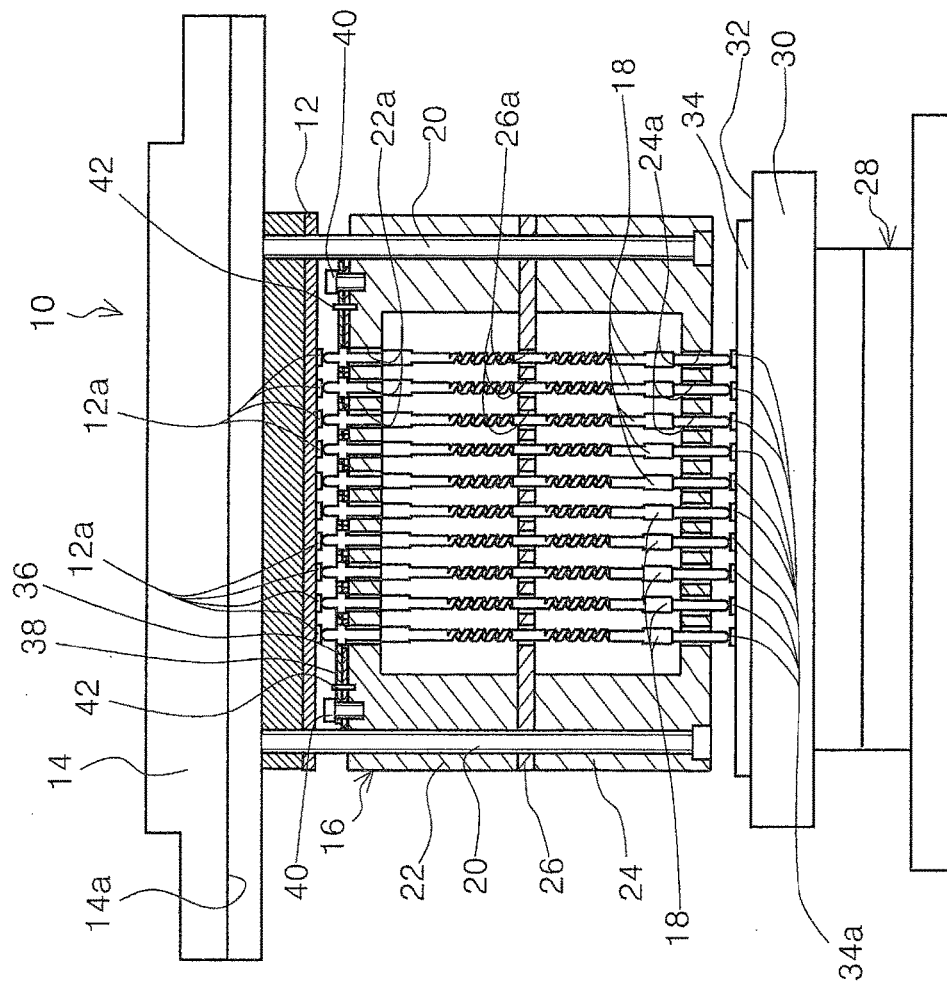
FIG. 1 is a partial cross-sectional view of a contact inspection device according to this embodiment.

Description is hereinafter made of embodiments of the present invention based on the drawings. The common constituent elements in all the embodiments, which are designated by the same reference numerals, are described only in the first embodiment and their description is omitted in the description of subsequent embodiments.

First Embodiment

<<<Outline of Contact Inspection Device>>>

Figure 2:
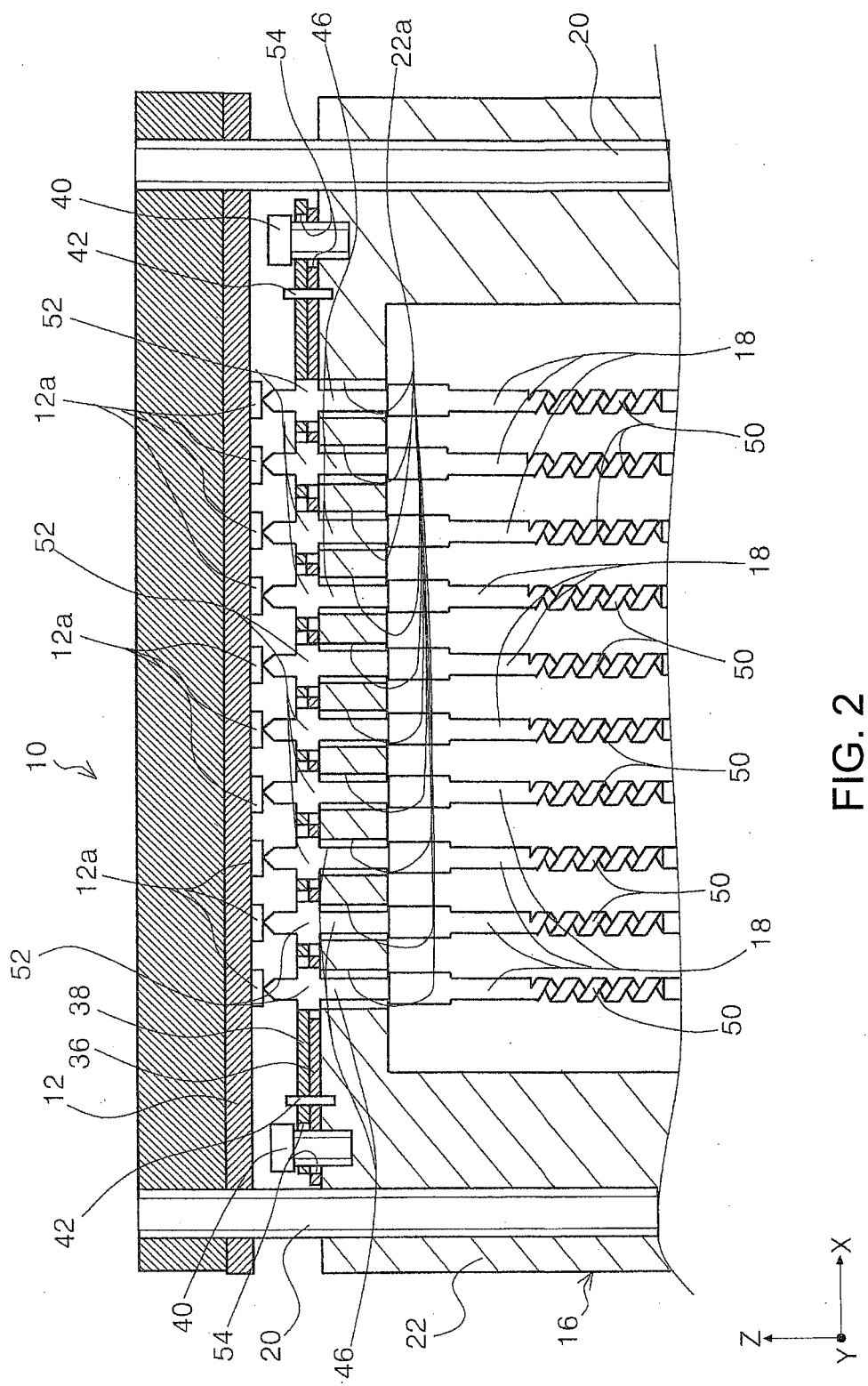
FIG. 2 is an enlarged view illustrating the relationship between rotation restricted portions and rotation restricting portions in the contact inspection device shown in FIG. 1.

FIG. 1 and FIG. 2 illustrate a probe card 10 as one embodiment of a "contact inspection device." The probe card 10 includes a probe substrate 12, a reinforcing plate 14, a probe head 16, and plural probes 18. The probe card 10 is electrically connected to a tester (not shown) and is attached to the tester for swingable motion relative to the tester.

In this embodiment, the probe substrate 12 has a disk-like (circular) shape, and is constituted as a multi-layer substrate including a ceramic substrate and a wiring substrate although not shown. Plural conductive contact portions 12a are provided on the −Z side surface as viewed in FIG. 1 (which is hereinafter referred to as "lower surface") of the probe substrate 12. In this embodiment, the Z-axis in FIG. 1 indicates the vertical direction, and the +Z side and −Z side mean the upside and downside, respectively.

Although not shown, plural wiring paths are provided in the probe substrate 12. Each wiring path is electrically connected at one end to one of the probes 18 via one of the conductive contact portions 12a provided on the lower surface of the probe substrate 12, and it is connected at the other end to one of plural conductive portions (not shown) provided on the +Z side surface (which is hereinafter referred to as "upper surface") of the probe substrate 12.

Each conductive portion (not shown) on the upper surface of the probe substrate 12 is connected to a tester (not shown).

The reinforcing plate 14 is attached to the upper surface of the probe substrate 12. The reinforcing plate 14 has a disk-like shape and is formed with a metal member. The −Z side surface of the reinforcing plate 14, in other words, the lower surface of the reinforcing plate 14, which faces the upper surface of the probe substrate 12, is formed as a flat surface 14a. The flat surface 14a of the reinforcing plate 14 (refer to FIG. 1) is formed to have a predetermined flatness (for example, 30 μm) or better. Because the probe substrate 12 attached to the reinforcing plate 14 is forced to have the same flatness as the flat surface 14a, the reinforcing plate 14 defines the flatness of the probe substrate 12.

The probe head 16 is detachably attached to the lower surface of the probe substrate 12 via fastening members 20. The probe head 16 includes an upper probe head 22, a lower probe head 24, and an intermediate retaining member 26. The upper probe head 22 and the lower probe head 24 are spaced apart in the Z-axis direction, i.e., in the vertical direction. In this embodiment, the upper probe head 22 is placed above and the lower probe head 24 is placed below in the vertical direction. In this embodiment, the upper probe head 22 and the lower probe head 24 are formed of non-conductive material such as ceramic.

The intermediate retaining member 26 is interposed between the upper probe head 22 and the lower probe head 24 in the vertical direction. In this embodiment, the intermediate retaining member 26 is constituted as a film member made of non-conductive resin material.

The upper probe head 22, the lower probe head 24, and the intermediate retaining member 26 have plural holes 22a, 24a, and 26a, respectively. The plural holes 22a, 24a, and 26a extend in the vertical direction (in the Z-axis direction), and have common axes extending in the vertical direction. In other words, the holes 22a, 24a, and 26a of each set are arranged coaxially.

The plural probes 18 extend through the probe head 16. Specifically, each probe 18 extends through a set of coaxially-arranged holes 22a, 24a, and 26a. In other words, the probes 18 extend through the upper probe head 22, the lower probe head 24, and the intermediate retaining member 26. Here, each probe 18 has a first end (lower end) and a second end (upper end) that individually protrude vertically from the probe head 16.

As shown in FIG. 1, an inspection stage 28 is provided below (on the −Z side as viewed in FIG. 1) the probe card 10. The inspection stage 28 is constituted by combining an X-stage, a Y-stage, a Z-stage, and a θ-stage. A chuck top 30 is mounted on top of the inspection stage 28. Thus, the chuck top 30 is positionally adjustable in an X-axis direction, a Y-axis direction orthogonal to the X-axis direction on a horizontal plane, and a vertical direction orthogonal to the horizontal plane (XY plane), i.e., a Z-axis direction. The chuck top 30 is also adjustable in its rotational position (θ-direction) about the Z-axis.

A mounting surface 32, on which a test object 34 is mounted, is provided on top of the chuck top 30. In this embodiment, the test object 34 is a semiconductor wafer into which multiple integrated circuits have been incorporated. Plural electrodes 34a are provided on an upper surface of the test object 34. Because the plural electrodes 34a are brought into contact with the first ends (lower ends) of the probes 18 with the second ends (upper ends) of the probes 18 being in contact with the contact portions 12a of the probe substrate 12, an electrical connection is established between the probe card 10 and the test object 34.

As shown in FIG. 2, plural positioning members 36 and 38 are attached to an upper surface of the probe head 16, i.e., an upper surface of the upper probe head 22, via fastening members 40 and positioning pins 42. In this embodiment, the positioning members 36 and 38 include a first positioning member 36 and a second positioning member 38. The positioning members 36 and 38 are described in detail later. The second ends (upper ends) of the probes 18 extend through the positioning members 36 and 38, and protrude toward the probe substrate 12 from the positioning members 36 and 38.

<<<Regarding Configuration of Probe>>>

Figure 3:
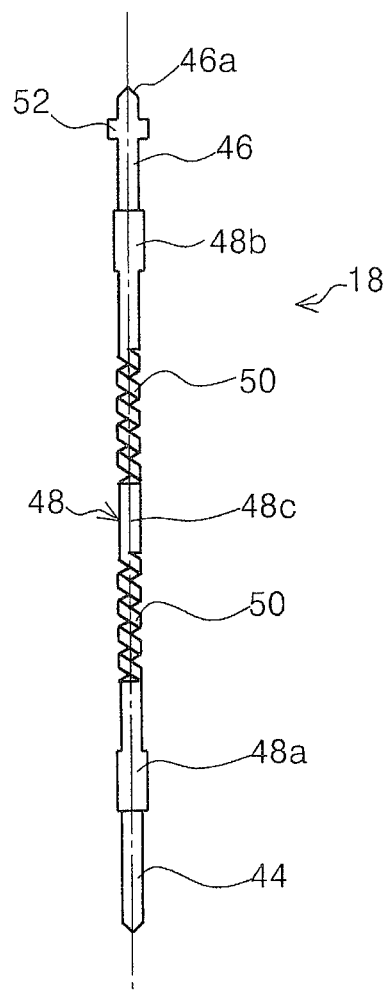
FIG. 3 is a side view of a probe according to this embodiment.
Figure 4:
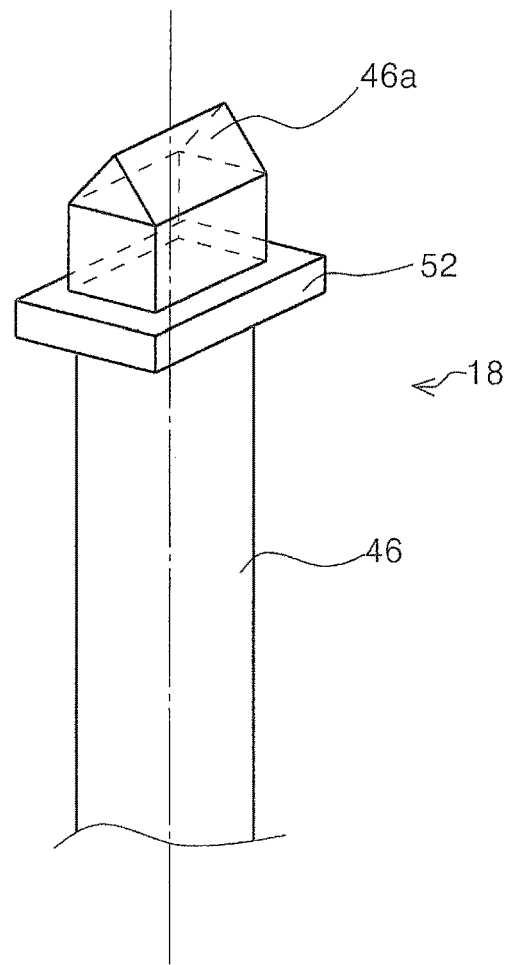
FIG. 4 is a perspective view illustrating a rotation restricted portion of the probe according to this embodiment.
Figure 4:
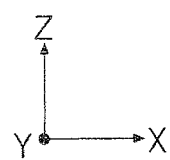

Referring now to FIG. 3 and FIG. 4, the configuration of each probe 18 is described in detail. Each probe 18 includes a first contact portion 44 forming the first end (lower end) of the probe 18, a second contact portion 46 forming the second end (upper end) of the probe 18, and an elastic portion 48. The first contact portion 44 and the second contact portion 46 are connected to opposite ends of the elastic portion 48.

In this embodiment, the first contact portion 44 and the second contact portion 46 are welded to opposite ends of the elastic portion 48. The elastic portion 48 has welding parts 48a and 48b at which the elastic portion 48 is welded to the first contact portion 44 and the second contact portion 46. The welding parts 48a and 48b are larger in diameter than other parts of the elastic portion 48. The holes 22a, 24a, and 26a of the probe head 16 have a diameter that is greater than that of the welding parts 48a and 48b, i.e., the maximum diameter of the probes 18.

The elastic portion 48 has slit portions 50 and 50 as spiral "slits" that generate an elastic force in the axial direction of the elastic portion 48 (in the Z-axis direction i.e., in the vertical direction). The slit portions 50 and 50 are provided at two locations spaced apart in the axial direction. An intermediate portion 48c, which corresponds to the intermediate retaining member 26 when the probe 18 is inserted through the probe head 16, is provided between the slit portions 50 and 50.

The second contact portion 46 has a polygonal rotation restricted portion 52. As shown in FIG. 4, in this embodiment, the rotation restricted portion 52 has a rectangular shape. In this embodiment, the thickness of the rotation restricted portion 52 in the axial direction is at least larger than that of the first positioning member 36. In other words, the rotation restricted portion 52 has a sufficient thickness to engage the first positioning member 36 and the second positioning member 38 when the probe 18 is inserted through the first positioning member 36 and the second positioning member 38.

The rotation restricted portion 52 has a size that is larger than the diameter of the holes 22a, 24a, and 26a of the probe head 16. In other words, when the probe 18 is inserted through the probe head 16, the rotation restricted portion 52 cannot pass through the hole 22a and the lower surface of the rotation restricted portion 52 abuts against the upper surface of the upper probe head 22. Thus, when the first contact portion 44 of the probe 18 is passed through its corresponding holes 22a, 24a, and 26a of the probe head 16 until it protrudes from the lower probe head 24, the rotation restricted portion 52 is supported by the upper probe head 22.

As shown in FIG. 4, in this embodiment, the second contact portion 46 has a tip portion 46a having the shape of a triangular prism extending in a direction orthogonal to the axial direction (Z-axis direction), i.e., in the X-axis direction or Y-axis direction. One edge of the triangular prism extending in the axial direction thereof is located at the top of the tip portion 46a in the vertical direction, in other words, forms a ridge. Thus, because this edge of the tip portion 46a will be brought into contact with one of the contact portions 12a of the probe substrate 12, the probe 18 and the contact portion 12a of the probe substrate 12 will make a line contact with each other.

The probes 18 are formed of conductive metal material. As one example, the probes 18 are formed of a conductive metal material having high toughness, such as nickel (Ni), nickel-phosphorus alloys (Ni—P), nickel-tungsten alloys (Ni—W), phosphor bronze, palladium-cobalt alloys (Pd—Co) and palladium-nickel-cobalt alloys (Pd—Ni—Co).

<<<Regarding Positioning Members>>>

Figure 5:
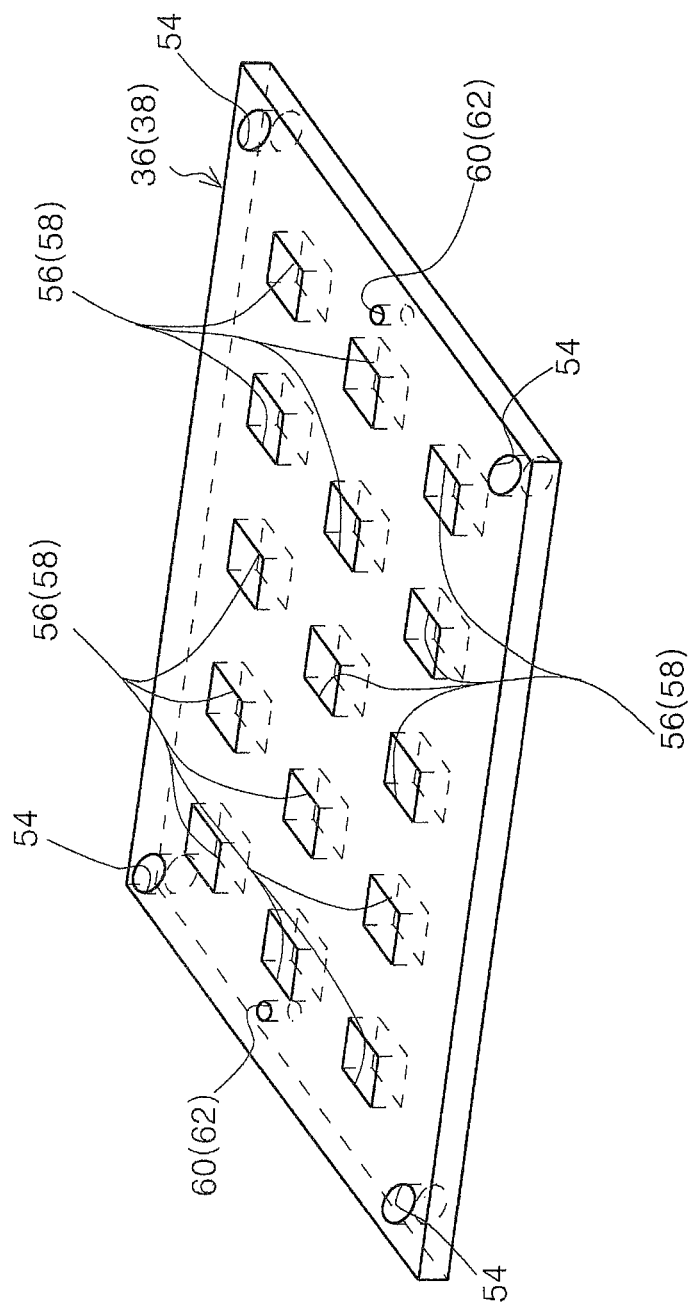
FIG. 5 is a perspective view of a positioning member according to this embodiment.
Figure 5:
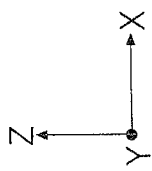

Referring next to FIG. 5, the first positioning member 36 and the second positioning member 38 are described. In this embodiment, the first positioning member 36 and the second positioning member 38 are formed as plate-like members made of non-conductive material such as ceramic. It should be noted that the first positioning member 36 is shown in FIG. 5 for descriptive purposes, and description is made using the first positioning member 36.

Figure 6:
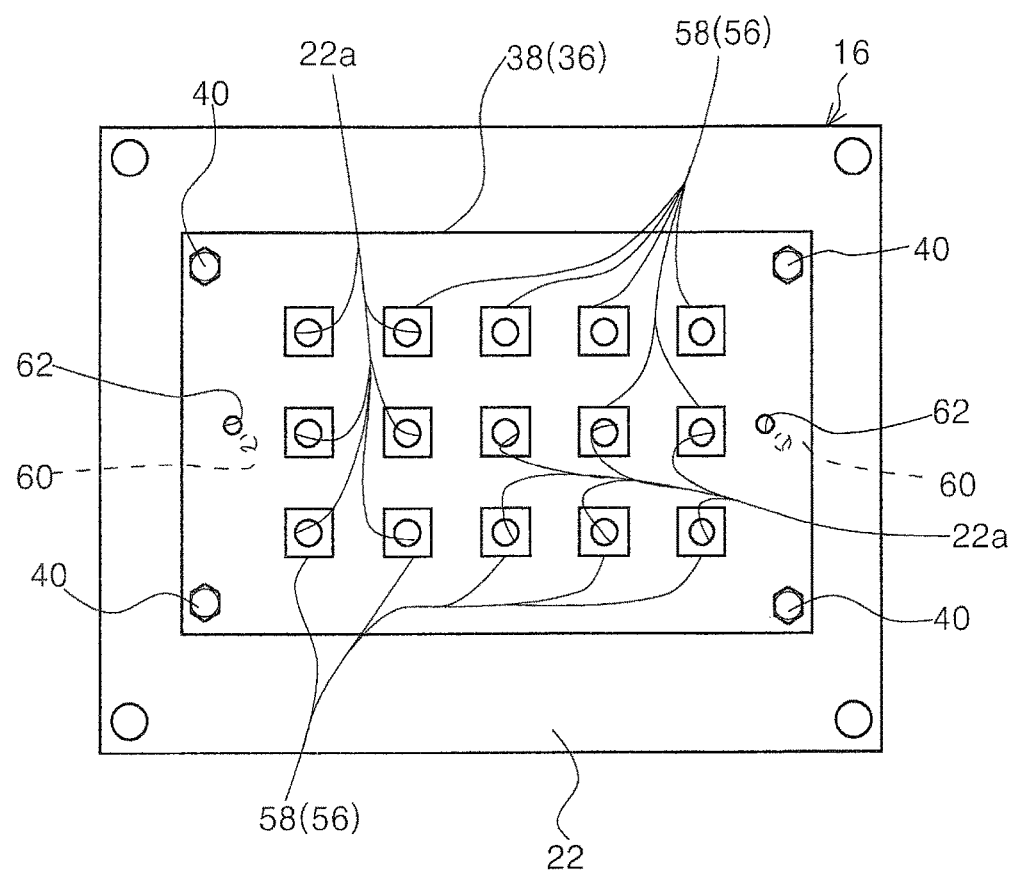
FIG. 6 is a plan view illustrating positioning members mounted on a probe head.
Figure 7:
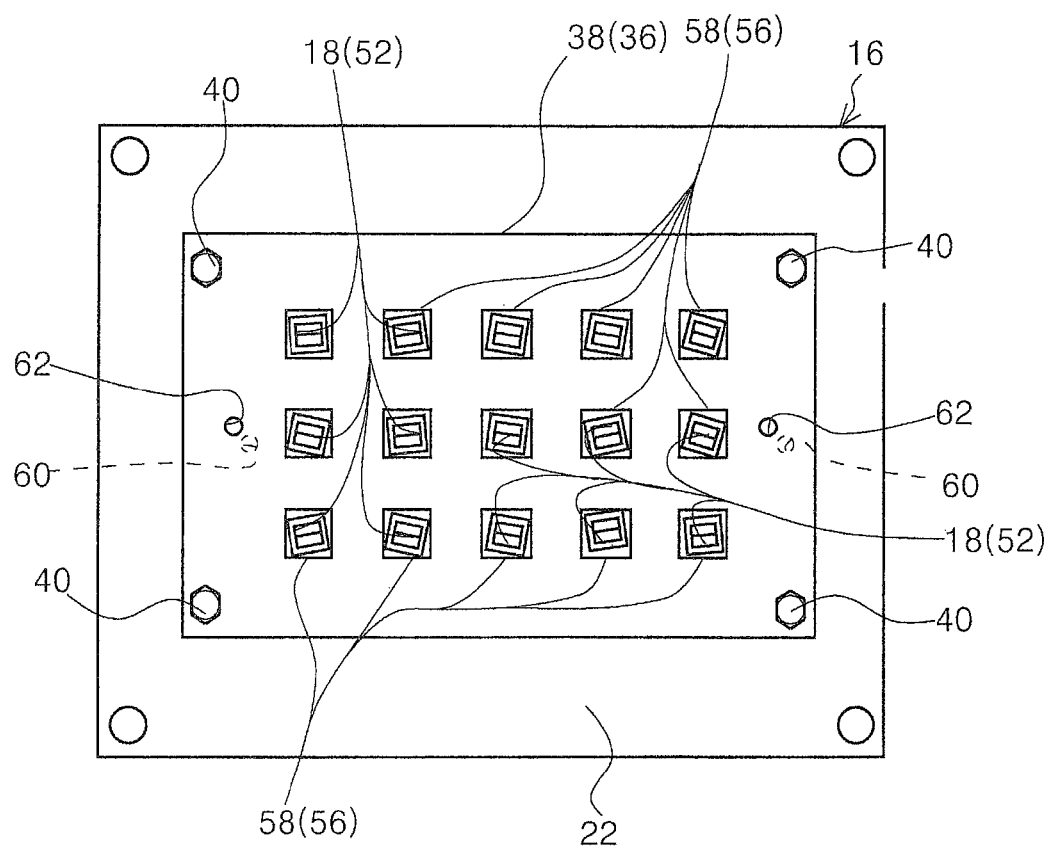
FIG. 7 is a plan view illustrating the state of probes inserted through the probe head and the positioning members.
Figure 10:
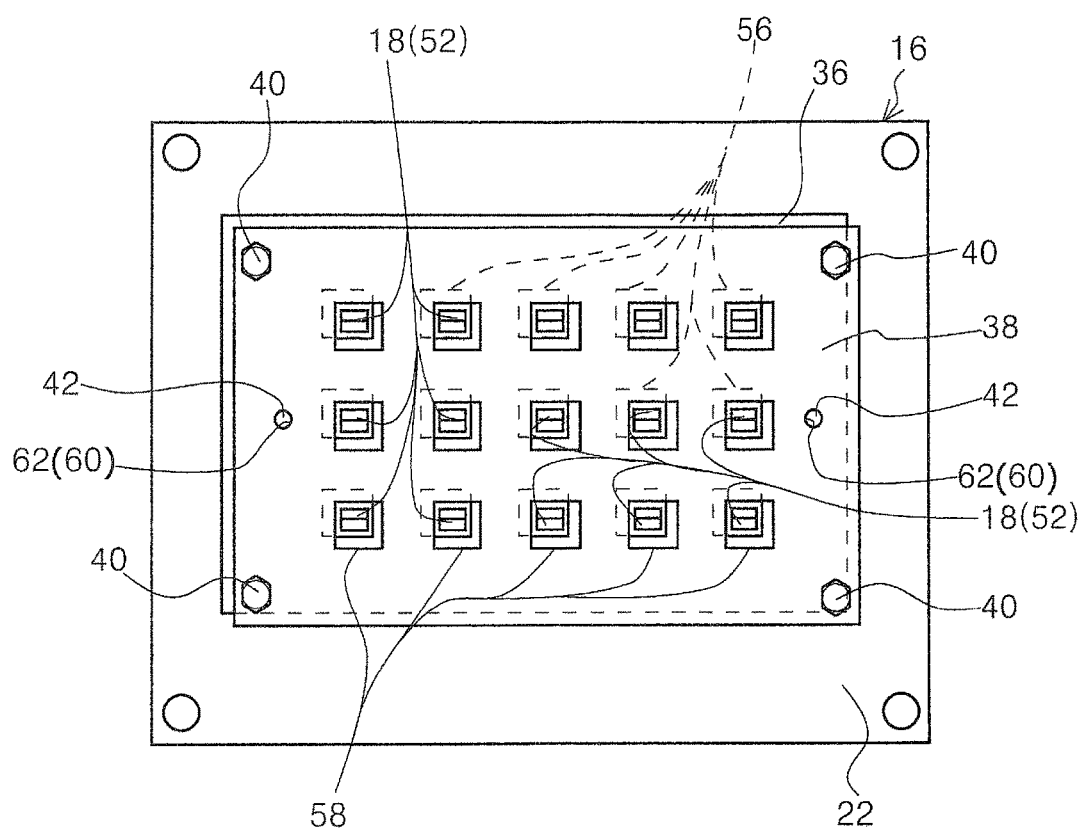
FIG. 10 is a plan view illustrating the state created by moving plural positioning members relative to each other to align the probes inserted through the probe head and to switch the probes from a rotation unrestricted state to a rotation restricted state.
Figure 10:
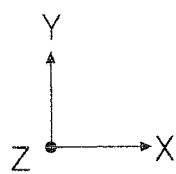

The first positioning member 36 has through holes 54, at its four corners, for fastening members 40 that are used to detachably attach the first positioning member 36 and the second positioning member 38 to the upper probe head 22. As shown in FIG. 5, the through holes 54 are formed as slotted holes extending in a diagonal direction of the first positioning member 36 and the second positioning member 38. In FIG. 6, FIG. 7 and FIG. 10, illustration of the through holes 54 is omitted.

The first positioning member 36 has plural rotation restricting portions 56 aligned at appropriate intervals in the X-axis direction and Y-axis direction. The rotation restricting portions 56 have a polygonal shape. In this embodiment, the rotation restricting portions 56 have a rectangular shape. The rotation restricting portions 56 have a size that is large enough that the rotation restricted portions 52 of the probes 18 can pass through them. The second positioning member 38 also has rotation restricting portions 58, which are similar to the rotation restricting portions 56 of the first positioning member 36.

The first positioning member 36 has plural positioning holes 60 and 60 for receiving the positioning pins 42. The second positioning member 38 also has plural positioning holes 62 and 62. The positioning holes 60 and 60 of the first positioning member 36 and the positioning holes 62 and 62 of the second positioning member 38 are formed such that the axes of the positioning holes 60 and 60 coincide with the axes of the positioning holes 62 and 62 when the first positioning member 36 and the second positioning member 38 are moved relative to each other, as described later.

<<<Regarding Switching of Probes Between Rotation Unrestricted State and Rotation Restricted State>>>

Referring next to FIG. 6 to FIG. 10, positioning and switching between a rotation unrestricted state and a rotation restricted state of the probes 18 extending through the probe head 16 are described.

FIG. 6 illustrates a state where the first positioning member 36 and the second positioning member 38 are attached to an upper part of the probe head 16, i.e., the upper surface of the upper probe head 22, via the fastening members 40. In this state, the rotation restricting portions 56 of the first positioning member 36 and the rotation restricting portions 58 of the second positioning member 38 correspond in position to each other in the X-axis direction and Y-axis direction. Specifically, the rectangular rotation restricting portions 56 and the rectangular rotation restricting portions 58 are located at the same positions in the X-axis direction and Y-axis direction and overlap with each other. It should be noted that, in this state, the positioning holes 60 of the first positioning member 36 and the positioning holes 62 of the second positioning member 38 are offset from each other in the X-axis direction and Y-axis direction.

Then, as shown in FIG. 7, the probes 18 are inserted from above the first positioning member 36 and the second positioning member 38 into the probe head 16 through the rotation restricting portions 56 and 58. As a result, the rotation restricted portions 52 of the probes 18 are received in the rotation restricting portions 56 and 58. In this state, because the rotation restricting portions 56 and 58 are larger in size than the rotation restricted portions 52, the rotation restricted portions 52 are still unaligned, in other words, the ridges of the tip portions 46a of the second contact portions 46 are directed in different directions (refer to FIG. 8(A) and FIG. 8(B)), in the rotation restricting portions 56.

In this state, the fastening members 40 are loosened. Then, the first positioning member 36 and the second positioning member 38 are moved relative to each other on the upper probe head 22 without being removed therefrom. Specifically, as shown in FIG. 8(A), the first positioning member 36 and the second positioning member 38 are moved along a diagonal of the rectangular rotation restricting portions 56 and 58 (refer to the arrow in FIG. 8(A)).

Figure 8A:
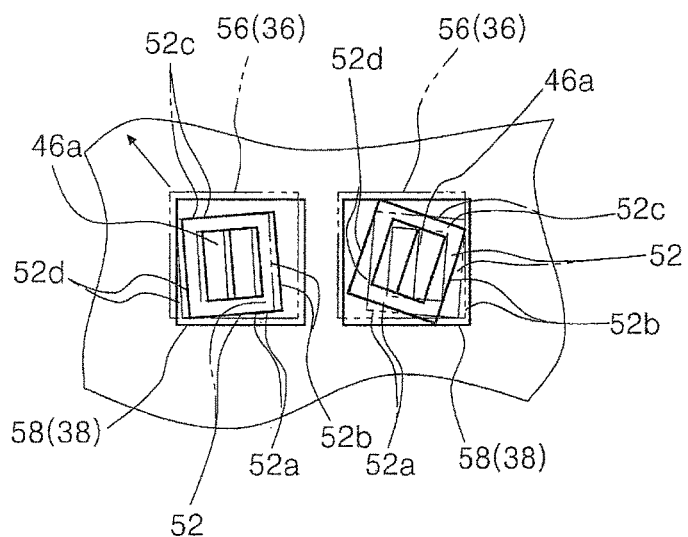
FIG. 8(A) is a plan view illustrating the relationship between the rotation restricting portions and the rotation restricted portions at a time when the probes are in a rotation unrestricted state.
Figure 8B:
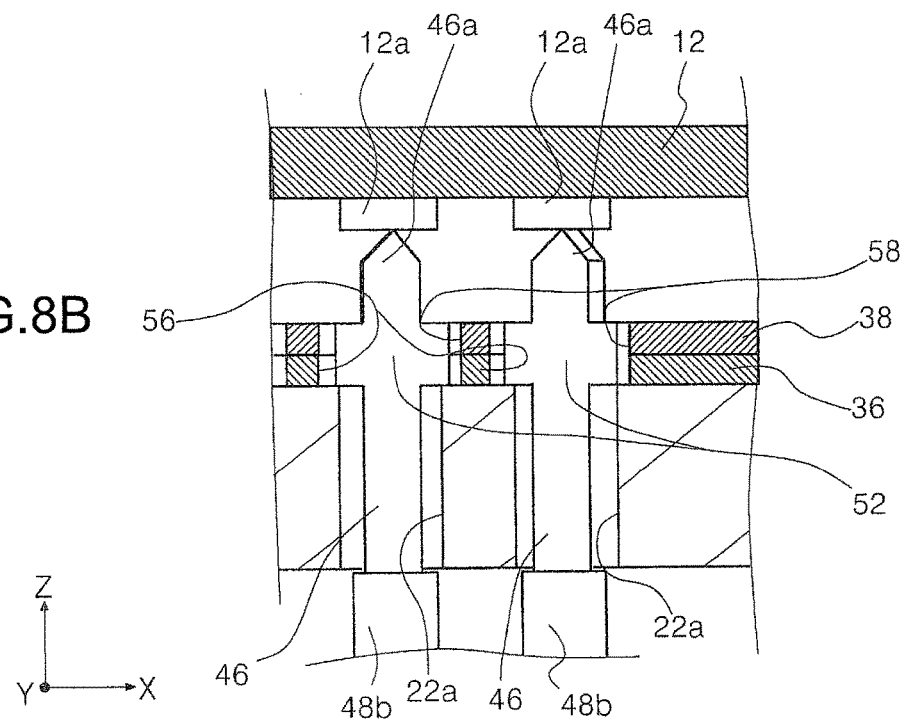
FIG. 8(B) is a partial cross-sectional view illustrating the state shown in FIG. 8(A).

When the first positioning member 36 and the second positioning member 38 are moved relative to each other along a diagonal of the rectangular rotation restricting portions 56 and 58 as shown in FIG. 8(A), the rotation restricted portions 52 of the probes 18 received in the rotation restricting portions 56 and 58 are pressed by the side walls of the rotation restricting portions 56 and 58 and rotate about their axes (refer to chain double-dashed lines in FIG. 8(A)).

Figure 9A:
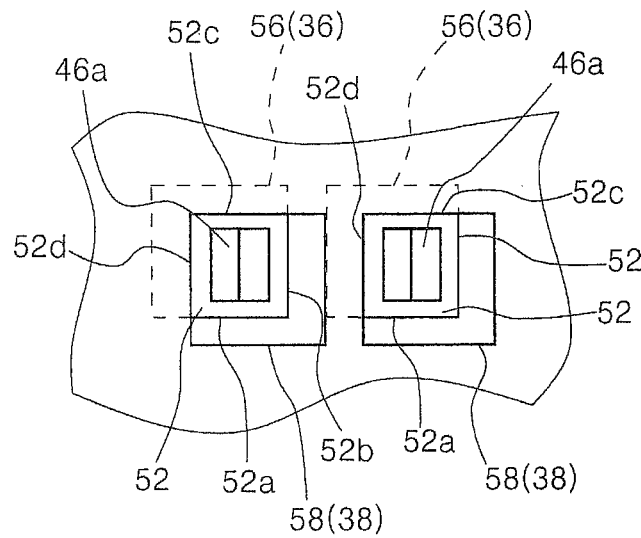
FIG. 9(A) is a plan view illustrating the relationship between the rotation restricting portions and the rotation restricted portions at a time when the probes are in a rotation restricted state.
Figure 9B:
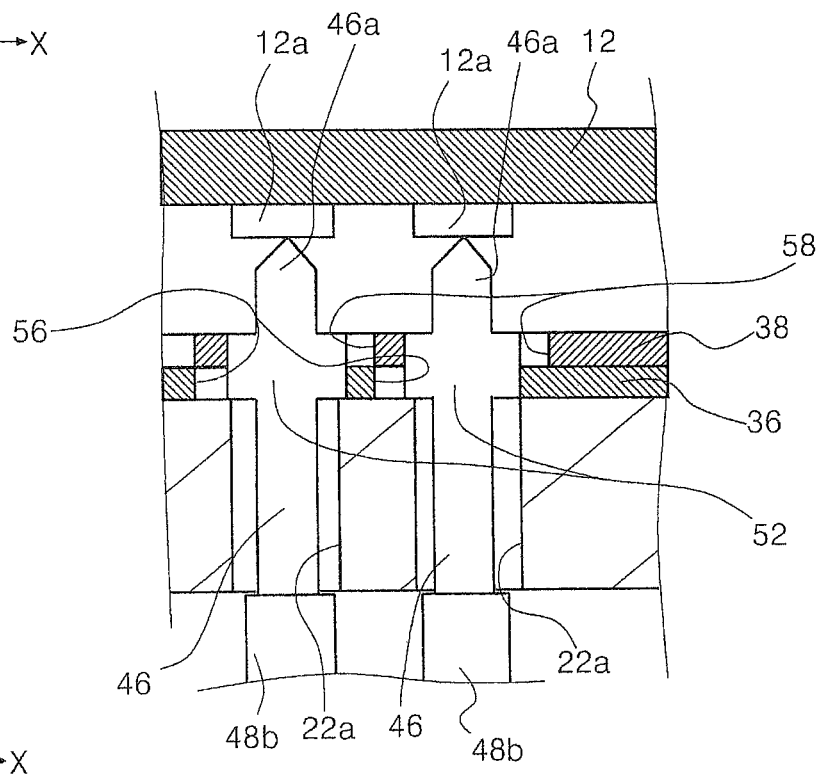
FIG. 9(B) is a partial cross-sectional view illustrating the state shown in FIG. 9(A).

When the first positioning member 36 and the second positioning member 38 are further moved relative to each other along a diagonal of the rectangular rotation restricting portions 56 and 58, the four sides of each of the rectangular rotation restricted portions 52 of the probes 18 engage side walls of its corresponding rotation restricting portions 56 and 58 as shown in FIG. 9(A) and FIG. 9(B). In this embodiment, of the four sides of each rectangular rotation restricted portion 52, sides 52a and 52b engage the first positioning member 36 and sides 52c and 52d engage the second positioning member 38.

In other words, because each of the first positioning member 36 and the second positioning member 38 engages one of the pair of opposite sides of their corresponding rectangular rotation restricted portion 52, the rotation restricted portions 52 are restricted from moving in the X-axis direction and Y-axis direction. In other words, the rotation restricted portions 52 are positioned by the first positioning member 36 and the second positioning member 38. In addition, because the rotation restricting portions 56 and 58 engage four sides 52a, 52b, 52c and 52d of the rotation restricted portions 52, the rotation restricting portions 56 and 58 can restrict the rotation restricted portions 52 from rotating about the axes of the probes 18.

As a result, as shown in FIG. 10, when the first positioning member 36 and the second positioning member 38 are moved relative to each other along a diagonal of the rectangular rotation restricting portions 56 and 58, the rotation restricted portions 52, which are unaligned when received in the rotation restricting portions 56 and 58, are positioned and restricted from rotating about the axes of the probes 18.

Then, because the positioning holes 60 and 60 of the first positioning member 36 and the positioning holes 62 and 62 of the second positioning member 38 correspond in position to each other in the X-axis direction and Y-axis direction, the relative positions of the first positioning member 36 and the second positioning member 38 can be fixed and the position and rotation restricted state of each rotation restricted portion 52 can be maintained by inserting the positioning pins 42 into the positioning holes 60 and 62 and tightening the fastening members 40. In other words, by moving the first positioning member 36 and the second positioning member 38 relative to each other, the probes 18 can be switched from a rotation unrestricted state to a rotation restricted state.

In addition, when the positioning pins 42 inserted into the positioning holes 60 and 62 are pulled out from the positioning holes 60 and 62 and the fastening members 40 are loosened from the state where the probes 18 are restricted from rotating as shown in FIG. 10, the first positioning member 36 and the second positioning member 38 can be moved relative to each other. Then, the probes 18 can be switched from the rotation restricted state to the rotation unrestricted state. Then, because the probes 18 can be individually pulled out from the probe head 16, any probes 18 damaged in the probe head 16 can be easily replaced.

In addition, because the probes 18 can be positioned and restricted from rotating simply by inserting the probes 18 into the probe head 16 and moving the first positioning member 36 and the second positioning member 38 relative to each other, the probe head 16 can be assembled easily.

Summary of First Embodiment

The above description is summarized. In the probe card 10 of this embodiment, when the plural positioning members 36 and 38 are moved relative to each other, the rotation restricting portions 56 and 58 align the probes 18 and switch the probes 18 from a rotation unrestricted state to a rotation restricted state. Thus, because the probes 18 are prevented from rotating relative to the contact portions 12*a* of the probe substrate 12 in contact with the probes 18, wear or damage of the contact portions 12*a* of the probe substrate 12 can be reduced.

In addition, in this embodiment, because the probes 18 can be aligned by moving the plural positioning members 36 and 38 relative to each other, the probes 18 can be easily positioned and the positional accuracy of the probes 18 can be improved. Thus, the contact portions 12*a* of the probe substrate 12 can be reduced in size, enabling them to cope with further reduction in pitch.

In addition, in this embodiment, the probes 18 can be switched between a rotation restricted state and a rotation unrestricted state by moving the plural positioning members 36 and 38 relative to each other with the probe head 16 removed from the probe substrate 12. This facilitates maintenance and replacement of the probes 18 and assembly of the probe head 16, which in turn improves work efficiency in maintenance and replacement of the probes 18 and in assembling the probe head 16.

In addition, according to this embodiment, the plural positioning members 36 and 38 include a first positioning member 36 and a second positioning member 38. The rotation restricting portions 56 and 58 of the first positioning member 36 and the second positioning member 38, and the rotation restricted portions 52 both have a rectangular shape. Thus, when the first positioning member 36 and the second positioning member 38 are moved relative to each other along a diagonal of the rectangular shape, the rotation restricting portions 56 and 58 restrict rotation of the rotation restricted portions 52. Thus, when the first positioning member 36 and the second positioning member 38 are moved relative to each other along a diagonal of the rectangular shape, the four sides of each of the rectangular rotation restricted portions 52 of the probes 18 are restrained by the rotation restricting portions 56 and 58 of the first positioning member 36 and the second positioning member 38. As a result, the probes 18 can be maintained in a rotation restricted state more reliably. In addition, because the four sides of each of the rotation restricted portions 52 are restrained, the probes 18 can be positioned with higher accuracy, enabling them to cope with narrower pitches.

In this embodiment, each probe 18 has an elastic portion 48 capable of freely expanding and contracting in the axial direction of the probe 18, and the first contact portion 44 and the second contact portion 46 connected to opposite ends of the elastic portion 48. When a force is applied to the first contact portion 44 and the second contact portion 46, the elastic portion 48 warps in the axial direction of the probe 18 and applies an elastic force generated by the warp to the first contact portion 44 and the second contact portion 46. As a result, the elastic portion 48 can apply an elastic force between the first contact portion 44 and the test object 34 and between the second contact portion 46 and its corresponding contact portion 12*a* of the probe substrate 12. This makes the contact between the first contact portion 44 and the test object 34 and the contact between the second contact portion 46 and its corresponding contact portion 12*a* of the probe substrate 12 more stable, and reduces poor connection therebetween.

In this embodiment, the probe head 16 has the holes 22*a*, 24*a*, and 26*a* for receiving the probes 18, and the rotation restricted portions 52 of the probes 18 are larger in size than the holes 22*a*, 24*a*, and 26*a*. Thus, when the probes 18 are inserted through the probe head 16, the rotation restricted portions 52 cannot pass through the holes 22*a*, 24*a*, and 26*a*. In other words, the rotation restricted portions 52 of the probes 18 also function as a stopper to the probe head 16.

In addition, according to this embodiment, because the rotation restricted portion 52 of each probe 18 contacts the holes 22*a*, 24*a*, and 26*a* of the probe head 16 at a position close to the tip portion 46*a* of the second contact portion 46 of the probe 18, each probe 18 is supported by the probe head 16 at a position close to the tip portion 46*a* of its second contact portion 46. As a result, the tip portion 46*a* of the second contact portion 46 of each probe 18 is restricted from displacing in a direction orthogonal to the axial direction of the probe 18 (Z-axis direction), i.e., in the X-axis direction or Y-axis direction compared to the first contact portion 44 thereof. This prevents the tip portions 46*a* of the second contact portions 46 of the probes 18 from displacing in the orthogonal direction (X-axis direction or Y-axis direction) relative to the contact portions 12*a* of the probe substrate 12 and can therefore reduce wear or damage of the contact portions 12*a* of the probe substrate 12.

In addition, in this embodiment, each probe 18 has at least one slit portion 50 extending spirally in the axial direction of the probe 18 between the first contact portion 44 and the second contact portion 46. The slit portion 50 can absorb the torsion applied to the probe 18 or inclination of the probe 18 and can therefore improve the service life of the probe 18. In addition, because the slit portion 50 is formed spirally in the axial direction of the probe 18, it can also absorb some of the pressure applied in the axial direction and can therefore improve the service life of the probe 18. In addition, the slit portion 50 can prevent the probe 18 from breakage or the like and can therefore improve the service life of the probe card 10.

In addition, in this embodiment, because the plural positioning members 36 and 38 are made of non-conductive material such as ceramic, they can provide reliable insulation between the plural probes 18 extending through the plural positioning members 36 and 38.

Modification of First Embodiment (1) While each probe 18 has two slit portions 50 in this embodiment, each probe 18 may instead have one or three or more slit portions 50.

(2) While the two slit portions 50 of each probe 18 are spiraled in the same direction, the two slit portions 50 may be instead spiraled in opposite directions.

(3) In this embodiment, the positioning pins 42 are inserted into the positioning holes 60 and 62 to position the first positioning member 36 and the second positioning member 38. However, the first positioning member 36 and the second positioning member 38 may be instead configured to be positioned by tightening the fastening members 40 inserted into the through holes 54 and 54 of the first positioning member 36 and the second positioning member 38 against the upper probe head 22 after the first positioning member 36 and the second positioning member 38 are moved relative to each other to position the probes 18. In other words, a configuration without the positioning pins 42 may be employed.

(4) While the rotation restricted portions 52 and the rotation restricting portions 56 and 58 both have a rectangular shape in this embodiment, at least either the rotation restricted portions 52 or the rotation restricting portions 56 and 58 may instead have a generally ellipsoidal shape. Even with this configuration, the generally ellipsoidal rotation restricting portions 56 and 58 can align the probes 18 and switch the probes 18 from a rotation unrestricted state to a rotation restricted state when the plural positioning members 36 and 38 are moved relative to each other. Thus, because the probes 18 are prevented from rotating relative to the contact portions 12*a* of the probe substrate 12 in contact with the probes 18, wear or damage of the contact portions 12*a* of the probe substrate 12 can be reduced.

Second Embodiment

Figure 11:
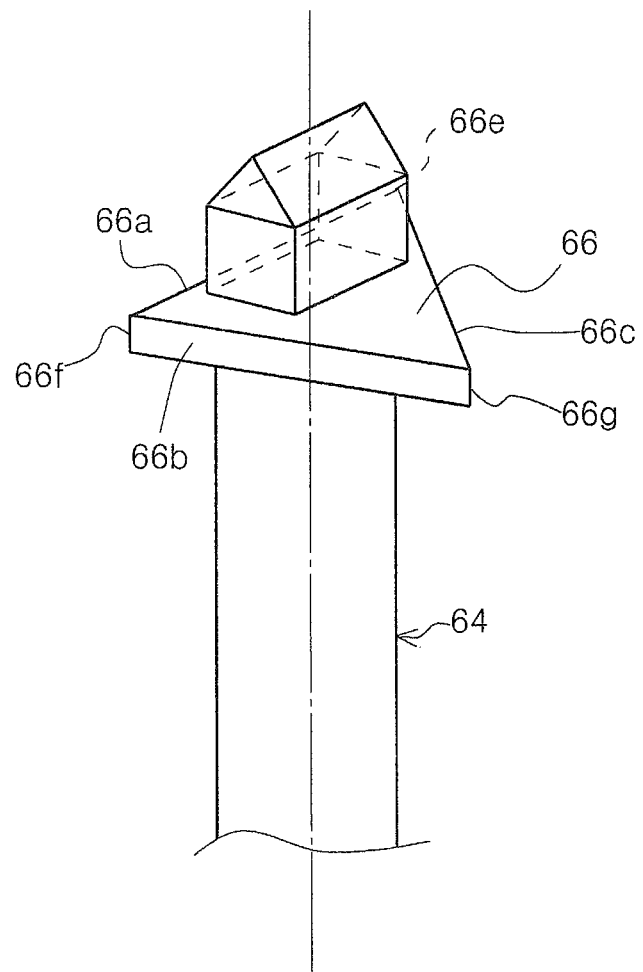
FIG. 11 is a perspective view illustrating a rotation restricted portion of a probe according to a second embodiment.
Figure 12A:
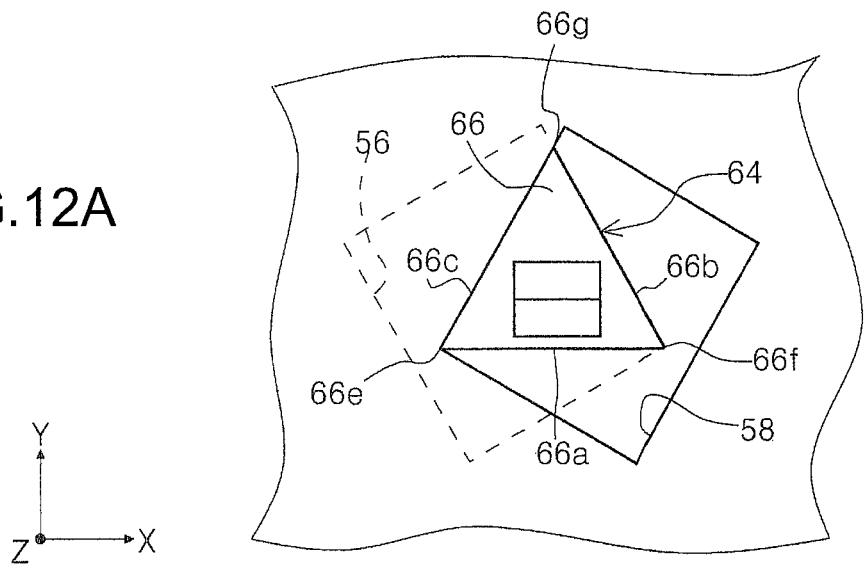
FIG. 12(A) is a plan view illustrating one engagement state between a rotation restricted portion of a probe and a rotation restricting portion according to the second embodiment.
Figure 12B:
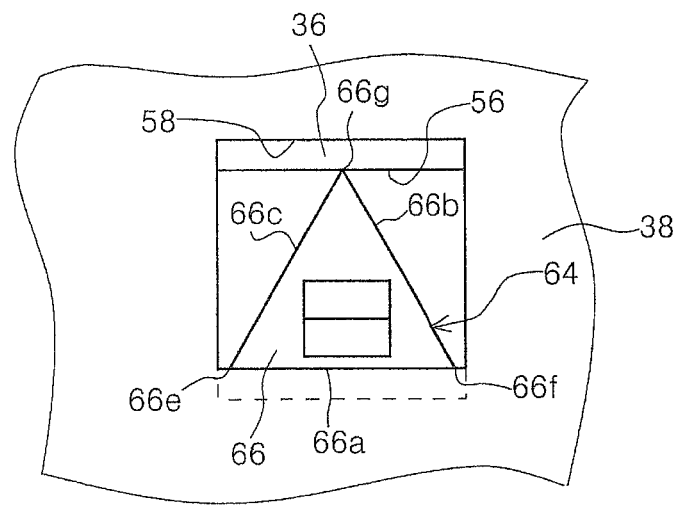
FIG. 12(B) is a plan view illustrating another engagement state between the rotation restricted portion of the probe and the rotation restricting portion.

Referring next to FIG. 11 to FIG. 12(B), a second embodiment is described. This embodiment is different from the first embodiment in that each probe 64 has a triangular rotation restricted portion 66 unlike the rotation restricted portions 52 of the probes 18 in the first embodiment.

As shown in FIG. 11, each probe 64 according to the second embodiment has a triangular rotation restricted portion 66. The probes 64 are the same in other respects as the probes 18 according to the first embodiment, therefore their description is not therefore repeated.

FIG. 12(A) illustrates an example of a rotation restricted state of a triangular rotation restricted portion 66 created by a rotation restricting portion 56 of the first positioning member 36 and a rotation restricting portion 58 of the second positioning member 38.

In this example, the first positioning member 36 and the second positioning member 38 are moved relative to each other so that two sides 66*b* and 66*c* of the three sides 66*a*, 66*b*, and 66*c* of the rotation restricted portion 66 can be restricted by the rotation restricting portions 56 and 58, respectively. Specifically, the first positioning member 36 is moved in the −X direction and −Y direction and the second positioning member 38 is moved in the +X direction and −Y direction as viewed in FIG. 12(A). Then, the side 66*b* of the rotation restricted portion 66 engages the rotation restricting portion 56, and the side 66*c* of the rotation restricted portion 66 engages the rotation restricting portion 58.

Thus, because two of the three sides of the rotation restricted portion 66 engage the rotation restricting portions 56 and 58, the rotation restricted portion 66 is restricted from rotating about the axis of the probe 64. In addition, as shown in FIG. 12(A), the vertex 66*e* between the sides 66*a* and 66*c* of the rotation restricted portion 66 engages a corner of the rotation restricting portion 58 and the vertex 66*f* between the sides 66*a* and 66*b* of the rotation restricted portion 66 engage a corner of the rotation restricting portion 56, the rotation restricted portion 66 is positioned by the rotation restricting portions 56 and 58. Thus, the rotation restricted portion 66 is positioned and restricted from rotating about the axis of the probe 64 by the rotation restricting portions 56 and 58.

FIG. 12(B) illustrates another example of a rotation restricted state of a triangular rotation restricted portion 66 created by a rotation restricting portion 56 of the first positioning member 36 and a rotation restricting portion 58 of the second positioning member 38.

In this example, the first positioning member 36 and the second positioning member 38 are moved relative to each other so that a side 66*a* of the three sides 66*a*, 66*b* and 66*c* of the rotation restricted portion 66 and a vertex 66*g* between the sides 66*b* and 66*c* are restricted by the rotation restricting portions 56 and 58, respectively. Specifically, the first positioning member 36 is moved in the −Y direction and the second positioning member 38 is moved in the +Y direction as viewed in FIG. 12(B). Then, the side 66*a* of the rotation restricted portion 66 engages the rotation restricting portion 58, and the vertex 66*g* of the rotation restricted portion 66 engages the rotation restricting portion 56.

Thus, because one side of the rotation restricted portion 66 and a vertex opposite the side engage the rotation restricting portions 58 and 56, respectively, the rotation restricted portion 66 is restricted from rotating about the axis of the probe 64. In addition, because the side 66*a* of the rotation restricted portion 66 engages the rotation restricting portion 58 and the vertex 66*g* between the sides 66*b* and 66*c* of the rotation restricted portion 66 engages the rotation restricting portion 56 as shown in FIG. 12(B), the rotation restricted portion 66 is positioned by the rotation restricting portions 56 and 58. Thus, the rotation restricted portion 66 is positioned and restricted from rotating about the axis of the probe 64 by the rotation restricting portions 56 and 58.

According to this embodiment, the rotation restricting portions 56 and 58 engage at least two sides 66*c* and 66*b*, or one side 66*a* and a vertex 66*g* opposite the side 66*a*, respectively, of each rotation restricted portion 66 having a triangular shape as one example of a polygonal shape, and thereby restricting rotation of the rotation restricted portion 66. Thus, because the probes 64 are prevented from rotating relative to the contact portions 12*a* of the probe substrate 12 in contact with the probes 64, wear or damage of the contact portions 12*a* of the probe substrate 12 can be reduced.

Third Embodiment

Figure 13:
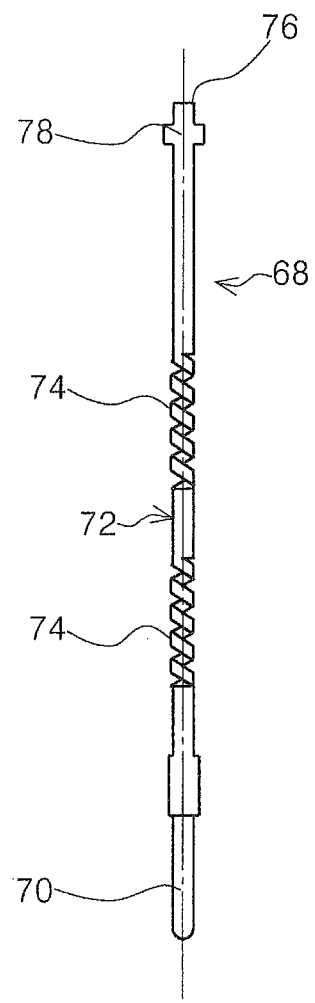
FIG. 13 is a side view of a probe according to a third embodiment.
Figure 13:
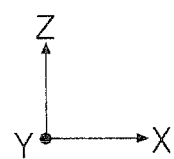

Referring to FIG. 13, a third embodiment is described. The third embodiment is different from the first embodiment in that each probe 68 according to the third embodiment does not have a second contact portion and has a rotation restricted portion in the elastic portion.

Referring to FIG. 13, each probe 68 according to the third embodiment includes a first contact portion 70 and an elastic portion 72. The elastic portion 72 is connected to the first contact portion 70 at the −Z side end thereof as viewed in FIG. 13. The elastic portion 72 has slit portions 74 and 74 at two locations spaced apart in the axial direction of the probe 68 (in the Z-axis direction in FIG. 13). The elastic portion 72 has a contact point portion 76 at its +Z side end as viewed in FIG. 13, and has a rotation restricted portion 78 in the vicinity of the contact point portion 76.

In this embodiment, the contact point portion 76 is formed as an end face of a cylindrical elastic portion 72. Thus, when the contact point portion 76 of the elastic portion 72 of the probe 68 is brought into contact with a contact portion 12a of the probe substrate 12, the contact portion 12a and the contact point portion 76 make a surface-to-surface contact with each other. This increases the contact area between each contact portion 12a and its corresponding contact point portion 76, and can therefore stabilizes the electrical connection between the probes 68 and the probe substrate 12.

Modification of First to Third Embodiments (1) The rotation restricted portions 52, 66, and 78 may have a polygonal shape other than rectangle and triangle, or the shape of a partially cut circle.

(2) The tip portion 46a of each probe 18 may have, instead of the shape of a triangular prism extending in a direction orthogonal to the axis of the probe 18, the shape of a sphere, the shape of a cylinder extending in the axial direction, the shape of a rectangular column extending in the axial direction, or the shape of a trapezoid extending in a direction orthogonal to the axial direction. When constituted as described above, the tip portion 46a of each probe 18 makes a line contact or surface-to-surface contact with its corresponding contact portion 12a of the probe substrate 12. This increases the contact area between the tip portion 46a of each probe 18 and its corresponding contact portion 12a of the probe substrate 12, thereby providing a more stable electrical connection between the tip portions 46a of the probes 18 and the probe substrate 12.

(3) While the rotation restricting portions 56 and 58 have a rectangular shape in these embodiments, the rotation restricting portions 56 and 58 may instead have a polygonal shape such as a triangle, a circular shape, or the shape of a partially cut circle depending on the shape of the rotation restricted portions 52, 66 or 78.

It goes without saying that the present invention is not limited to the above embodiments, and various modifications are possible within the scope of the invention set forth in the claims and such modifications are also included in the scope of the present invention.

The invention claimed is:

1. A contact inspection device that performs contact inspection of a test object, comprising:
plural probes each having a first end to be brought into contact with the test object and a second end located at an opposite side of the first end in an axial direction of the probe;
a probe substrate including contact portions in contact with respective second ends of the probes;
a probe head through which the plural probes extend and which is detachably attached to the probe substrate; and
plural positioning members which are provided on a surface of the probe head facing the probe substrate and through which the plural probes extend, wherein
each of the probes has a rotation restricted portion provided on the side of the second end, said rotation restricted portion protruding in a direction perpendicular to the axial direction,
each of the plural positioning members has rotation restricting portions surrounding the rotation restricted portions,
when the plural positioning members are moved relative to each other, the rotation restricting portions align the probes and switch the probes from a rotation unrestricted state to a rotation restricted state, and
the probes are configured to be individually pulled out from the probe head toward the probe substrate by moving the plural positioning members relative to each other.

2. The contact inspection device according to claim 1, wherein the rotation restricted portions have a polygonal shape in a cross section perpendicular to the axial direction, and
wherein the rotation restricting portions engage at least two sides, or one side and one vertex opposite the one side, of each of the rotation restricted portions to restrict rotation thereof.

3. The contact inspection device according to claim 2, wherein each of the probes includes a first contact portion forming the first end of the probe, a second contact portion forming the second end of the probe and having the rotation restricted portion, and an elastic portion having opposite ends to which the first contact portion and the second contact portion are connected and capable of freely expanding and contracting in the axial direction of the probe.

4. The contact inspection device according to claim 2, wherein the second ends of the probes make a line or surface-to-surface contact with the corresponding contact portions of the probe substrate.

5. The contact inspection device according to claim 2, wherein the probe head has holes for receiving the probes, and the rotation restricted portions of the probes are larger in size than the holes.

6. The contact inspection device according to claim 2, wherein each of the probes has at least one slit extending spirally in the axial direction of the probe between the first end and the second end.

7. The contact inspection device according to claim 2, wherein the plural positioning members are made of non-conductive material.

8. The contact inspection device according to claim 1, wherein the plural positioning members include a first positioning member and a second positioning member,
wherein the rotation restricting portions of the first positioning member and the second positioning member have a rectangular shape,
wherein the rotation restricted portions have a rectangular shape, and
wherein, when the first positioning member and the second positioning member are moved relative to each other along a diagonal of the rectangular shape, the rotation restricting portions restrict rotation of the rotation restricted portions.

9. The contact inspection device according to claim 8, wherein each of the probes includes a first contact portion forming the first end of the probe, a second contact portion forming the second end of the probe and having the rotation restricted portion, and an elastic portion having opposite ends to which the first contact portion and the second contact portion are connected and capable of freely expanding and contracting in the axial direction of the probe.

10. The contact inspection device according to claim 8, wherein the probe head has holes for receiving the probes, and the rotation restricted portions of the probes are larger in size than the holes.

11. The contact inspection device according to claim 8, wherein each of the probes has at least one slit extending spirally in the axial direction of the probe between the first end and the second end.

12. The contact inspection device according to claim 8, wherein the plural positioning members are made of non-conductive material.

13. The contact inspection device according to claim 1, wherein at least either the rotation restricted portions or the rotation restricting portions have a generally ellipsoidal shape.

14. The contact inspection device according to claim 1, wherein each of the probes includes a first contact portion forming the first end of the probe, a second contact portion forming the second end of the probe and having the rotation restricted portion, and an elastic portion having opposite ends to which the first contact portion and the second contact portion are connected and capable of freely expanding and contracting in the axial direction of the probe.

15. The contact inspection device according to claim 14, wherein the probe head has holes for receiving the probes, and the rotation restricted portions of the probes are larger in size than the holes.

16. The contact inspection device according to claim 1, wherein the second ends of the probes make a line or surface-to-surface contact with the corresponding contact portions of the probe substrate.

17. The contact inspection device according to claim 1, wherein the probe head has holes for receiving the probes, and the rotation restricted portions of the probes are larger in size in the direction perpendicular to the axial direction than the holes.

18. The contact inspection device according to claim 1, wherein each of the probes has at least one slit extending spirally in the axial direction of the probe between the first end and the second end.

19. The contact inspection device according to claim 1, wherein the plural positioning members are made of non-conductive material.

20. The contact inspection device according to claim 1, wherein
each of the plural probes extends through the probe head while the first end protrudes vertically from the probe head, and
the rotation restricted portions are mounted on a surface of the probe head on which the positioning members are provided in such a manner that the probes can be pulled out from said surface toward the probe substrate.

21. The contact inspection device according to claim 1, wherein the rotation restricting portions engage the rotation restricted portions so as to surround an outer surface of the rotation restricted portion in the direction perpendicular to the axial direction.

22. The contact inspection device according to claim 1, wherein the positioning members abut the surface of the probe head through which the plural probes extend.

23. The contact inspection device according to claim 1, wherein a lower surface of the rotation restricted portion abuts an upper surface of the probe head.

\* \* \* \* \*